United States Patent
Baek et al.

(10) Patent No.: US 6,242,276 B1
(45) Date of Patent: Jun. 5, 2001

(54) METHOD FOR FABRICATING MICRO INERTIA SENSOR

(75) Inventors: Seog-soon Baek; Byeoung-ju Ha, both of Suwon; Young-soo Oh, Seongnam, all of (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 09/482,528

(22) Filed: Jan. 14, 2000

(30) Foreign Application Priority Data

Jan. 15, 1999 (KR) .................................................. 99-980

(51) Int. Cl.[7] .................................................. H01L 21/00
(52) U.S. Cl. .................................................. 438/51; 438/51
(58) Field of Search ............................ 438/51, 106, 507, 438/406, 510, 524, 959, 50, 52, 702, 924

(56) References Cited

U.S. PATENT DOCUMENTS

| | | | |
|---|---|---|---|
| 4,699,006 | * 10/1987 | Boxenhorn | 73/517 |
| 5,198,390 | * 3/1993 | MacDonald et al. | 438/51 |
| 5,492,596 | * 2/1996 | Cho | 156/632 |
| 5,610,431 | * 3/1997 | Martin | 257/415 |
| 6,044,705 | * 4/2000 | Neukermans et al. | 73/504 |

* cited by examiner

Primary Examiner—David Nelms
Assistant Examiner—David Nhu
(74) Attorney, Agent, or Firm—Burns, Doane, Swecker & Mathis, LLP

(57) ABSTRACT

A micro inertia sensor fabrication method in which thick silicon bonded to glass is processed at a high sectional ratio, is provided. In this method, silicon is bonded to a glass substrate, the bonded silicon is polished to have a desired thickness, a silicon structure is formed by etching the polished silicon using an RIE method, and the silicon structure is separated from the bottom by selectively etching glass below the silicon structure via grooves in etched silicon. Since the thick silicon bonded to glass is processed at a high sectional ratio, the area and thickness of the silicon to be measured are increased. Also, this method is simple since only one mask is used.

14 Claims, 12 Drawing Sheets

FIG.1A (PIROR ART)
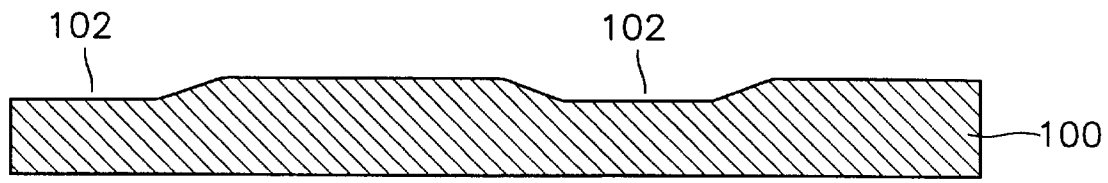
FIG.1B (PIROR ART)
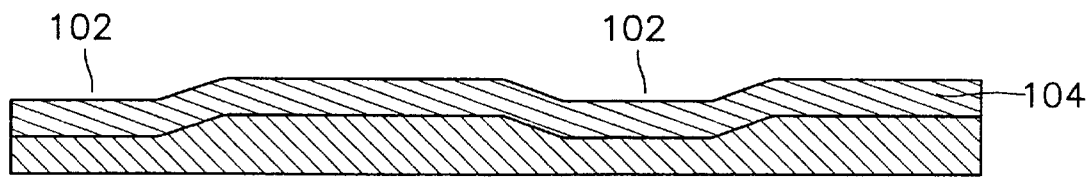
FIG.1C (PIROR ART)
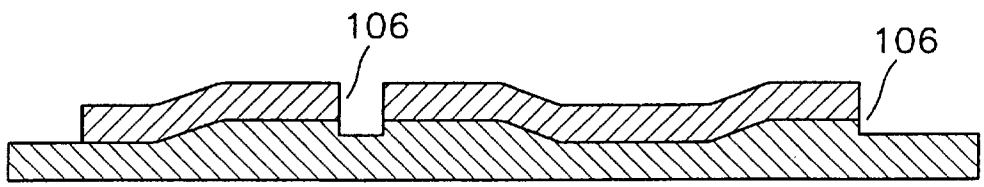

METHOD FOR FABRICATING MICRO INERTIA SENSOR

BACKGROUND OF THE INVENTION

1. Field of the Invention

The present invention relates to a method of fabricating a micro inertia sensor, in which thick silicon bonded to glass is processed at a high section ratio.

2. Description of the Related Art

Electrostatic capacity micro inertia sensors are being actively researched and developed. Acceleration sensors have already been manufactured and merchandised, and gyroscopes have been completed in research and development and has entered the initial steps of commercialization. Hence, present research and development into inertia sensors is directed in directions of increasing the reliability and performance and lowering the price. In order to achieve the research and development directions, the area of an inertia sensor measured must be large, and the inertia sensor must be solid on virtue of a high stiffness of a fine structure. Also, the fabrication method of an inertia sensor must be simple.

One method being used up to now in accordance with this trend is a method of fabricating inertia sensors using silicon bonded to glass as shown in FIGS. 1A, 1B and 1C. This method is disclosed in U.S. Pat. No. 5,492,596, and will now be described with respect to FIGS. 1A through 3B.

First, as shown in FIG. 1A, when a silicon wafer 100 is bonded to glass, it is etched by about 2 μm to form a space 102. Then, as shown in FIG. 1B, boron is heavy-doped on the surface of the silicon wafer 100. As shown in FIG. 1 C, a boron-doped silicon surface 104 is etched by reactive ion etching (RIE) forming grades 106. Here, the depth of etching must be slightly deeper than the thickness of the boron-doped silicon surface 104.

In the meantime, as shown in FIGS. 2A through 2C, a multi-metal system 202 is deposited in the grooves 200 with constituent metal layers 210 and 214 metal electrodes 212 and 220, with stand offs 230, are formed on glass.

Next, as shown in FIG. 3A, glass having electrodes thereon is bonded to the silicon doped with boron. Then, as shown in FIG. 3B, a silicon surface 100 doped with no boron is etched by an etchant having different etching speeds depending on the concentration of boron such as EDP, and thus only a boron-doped surface remains.

This fabricating method is complicated, and the depth at which boron is heavy doped is limited. Thus, it is difficult to fabricate a thick (e.g., about 10 μm) structure, and stresses are generated due to the difference in the concentration at which boron is doped. Also, since glass is bonded to silicon in a narrow space, silicon is attached to glass even in the space 102 by a voltage applied during bonding.

In contrast to the above-described method, there is a method of relatively simply fabricating sensors using only single crystal silicon, as shown in FIGS. 4A through 4F. This method, which is generally called single crystal reactive etching and metalization (SCREAM), is disclosed in U.S. Pat. No. 5,198,390.

First, as shown in FIG. 4A, a thermal oxide layer 314 is formed on single crystal silicon 312, and a photoresist pattern is formed by utilizing a photoresist layer 316. Then, as shown in FIG. 4B, the resultant structure is etched by RIE.

Next, as shown in FIG. 4C, a silicon oxide layer 332 is formed on lateral surfaces 324 and bottom surfaces 326. Then, as shown in FIG. 4D, a metal layer 334 is deposited, and a photoresist pattern 338 is formed on the resultant structure. Thus, as shown in FIG. 4E, the metal layer 334 and the oxide layer 332 are partially removed. At this time, the oxide layer and the metal layer on the bottom surfaces of holes engraved by the first RIE are completely removed.

Thereafter, as shown in FIG. 4F, silicon below a structure 354 is etched using a typical silicon isotropic etchant, thereby forming a structure which floats over the bottom.

This method is relatively simple by using only a single crystal line wafer, but also requires two masks. Also, in this method, a metal layer and an oxide layer must be formed on the lateral surface and bottom surface of a narrow and deep groove, and again patterned thereon, so that the section ratio of the etched groove is limited. Therefore, it is difficult to fabricate a structure having a narrow and deep groove. Furthermore, the use of the single crystal line wafer increases the parasitic capacitance upon measurement, and the absence of an etch stop layer upon RIE makes etching to a precise thickness difficult. Thus, the thickness of a structure is entirely non-uniform. Also, the bottom 354 of a beam is also etched by silicon anisotropic etching, thus making it difficult to maintain the thickness of the beam uniform. If no oxide layer is deposited on the upper sidewall 324 of a structure, silicon on the upper portion 354' may be etched while silicon on the bottom portion is etched by silicon isotropic etchant for a long time.

SUMMARY OF THE INVENTION

To solve the above problems, an object of the present invention is to provide a method of fabricating micro inertia sensors, in which a thick silicon layer bonded to glass is processed at a high section ratio to increase the area and thickness of measurement, so that the reliability and performance of the sensors are improved, the use of glass, which is a dielectric, instead of silicon as a substrate eliminates a parasitic capacitance which is generally induced via a silicon substrate, and a simple process using only one mask lowers the manufacturing cost.

To achieve the above object, there is provided a method of fabricating a micro inertia sensor, comprising: (a) bonding bulk silicon to a glass substrate; (b) polishing the bonded bulk silicon to have a desired thickness; (c) forming an inertia sensor structure by anisotropically etching the polished bulk silicon; (d) forming a vacuum space by etching glass below the silicon inertia sensor structure; and (e) depositing a metal for use as an electrode on the entire surface of the silicon inertia sensor structure which has been etched.

It is preferable that, in the step (a), the glass substrate is formed of Pyrex® glass, the bulk silicon is $n^+$ or $p^+$-doped bulk silicon, and the glass substrate is bonded to the bulk silicon by anodic bonding.

Also, it is preferable that the anisotropic etching method in the step (c) is a reactive ion etching (RIE) method using a photoresist pattern formed on the polished bulk silicon. Preferably, the RIE method is performed at an etching selectivity of the glass substrate to the bulk silicon which is about 1:100 to 1:300.

It is also preferable that the step (d) is performed using a hydrofluoric (HF) solution.

BRIEF DESCRIPTION OF THE DRAWINGS

The above objective and advantages of the present invention will become more apparent by describing in detail a preferred embodiment thereof with reference to the attached drawings in which:

FIGS. 1A through 1C, 2A through 2C and 3A and 3B are cross-sectional views illustrating the steps of a conventional method for fabricating micro inertia sensors;

DESCRIPTION OF THE PREFERRED EMBODIMENT

As shown in FIGS. 5A through 5F, a method of fabricating a micro inertia sensor according to the present invention includes: 1) bonding silicon to a glass substrate; 2) polishing the bonded silicon to a desired thickness; 3) forming a structure by etching the polished silicon using a RIE method; 4) isolating a silicon structure from the glass bottom by selectively etching glass below the silicon structure through a groove in the etched silicon; and 5) depositing metal electrodes.

Figure 2A:
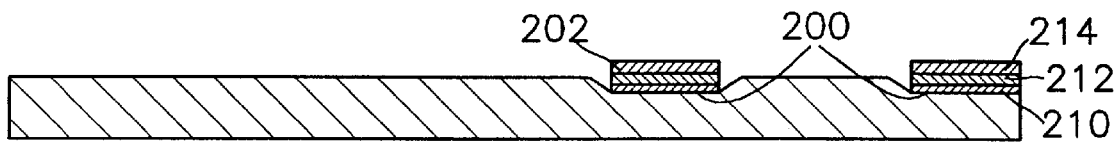
Figure 2B:
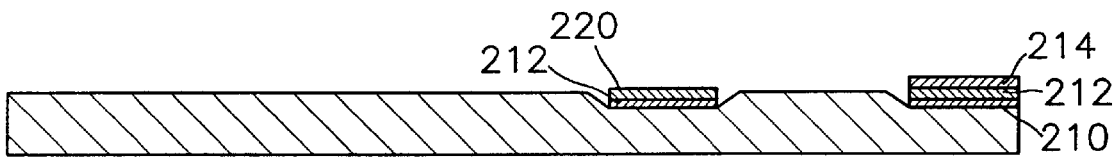
Figure 2C:
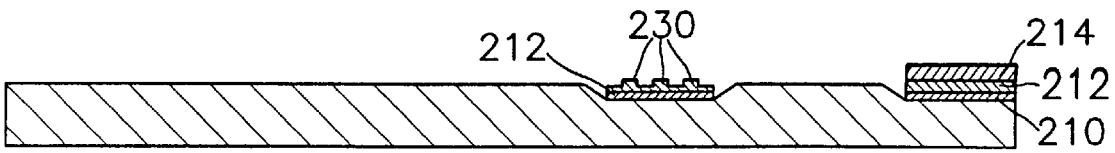
Figure 3A:
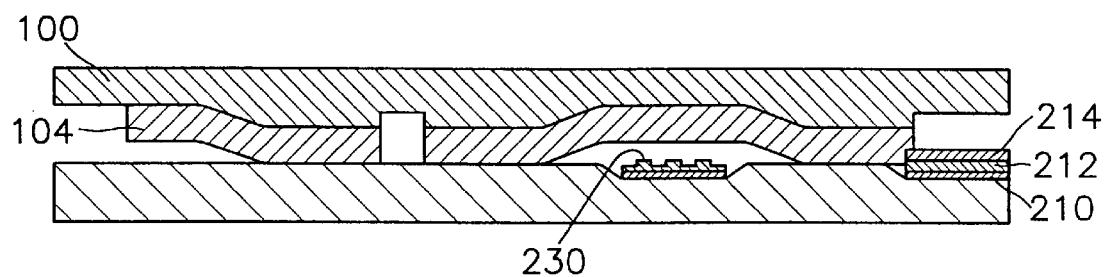
Figure 3B:
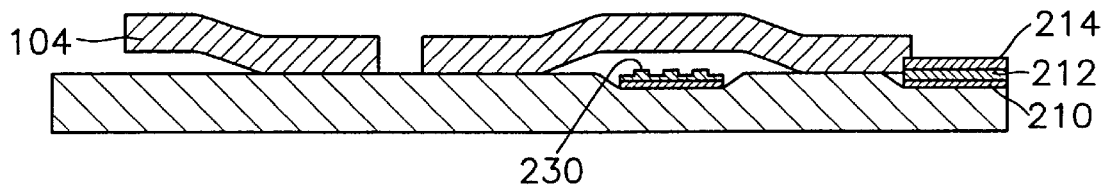
Figure 4A:
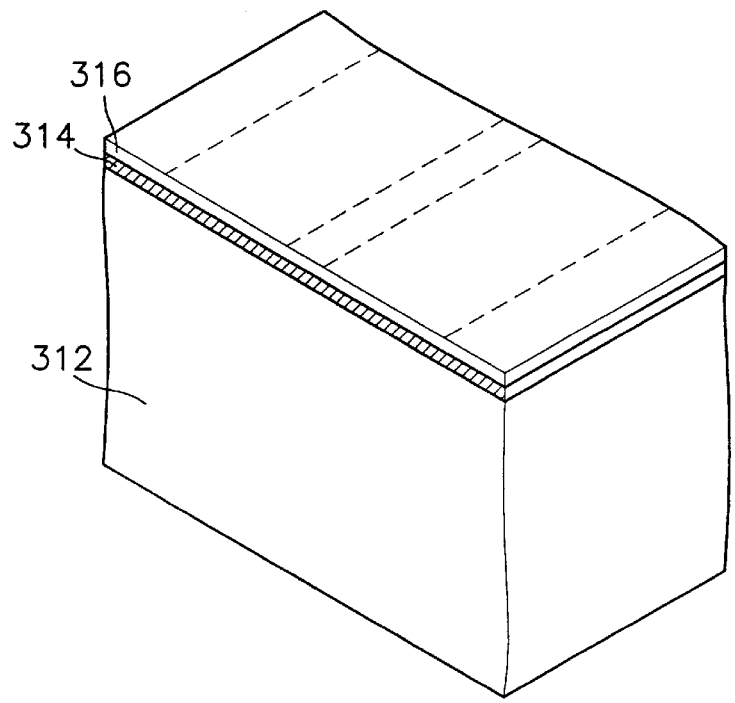
FIGS. 4A through 4F are cross-sectional views illustrating the steps of another conventional method for fabricating micro inertia sensors.
Figure 4B:
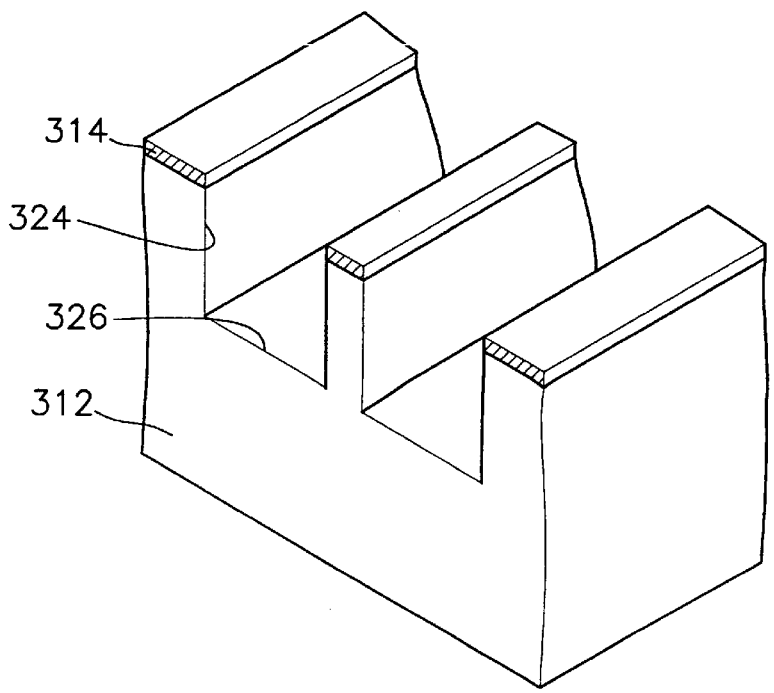
Figure 4C:
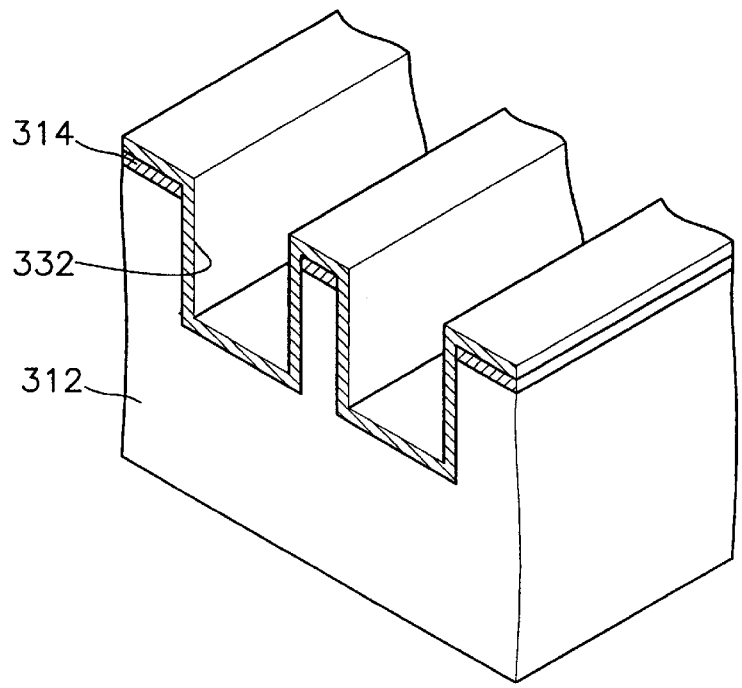
Figure 4D:
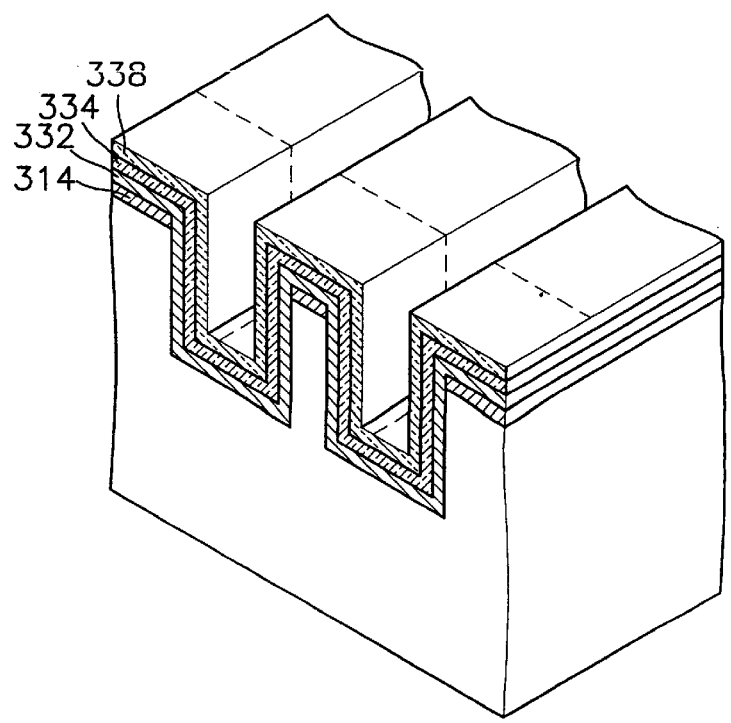
Figure 4E:
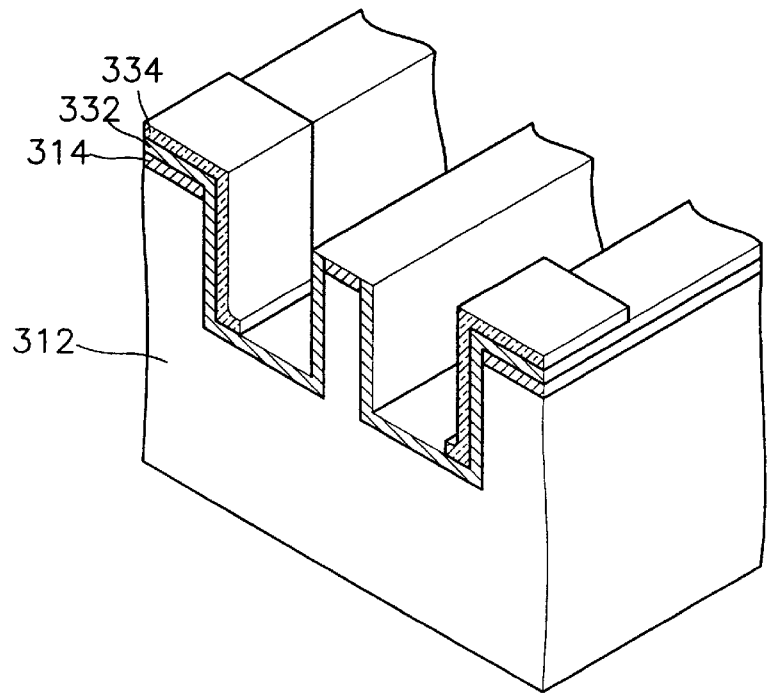
Figure 4F:
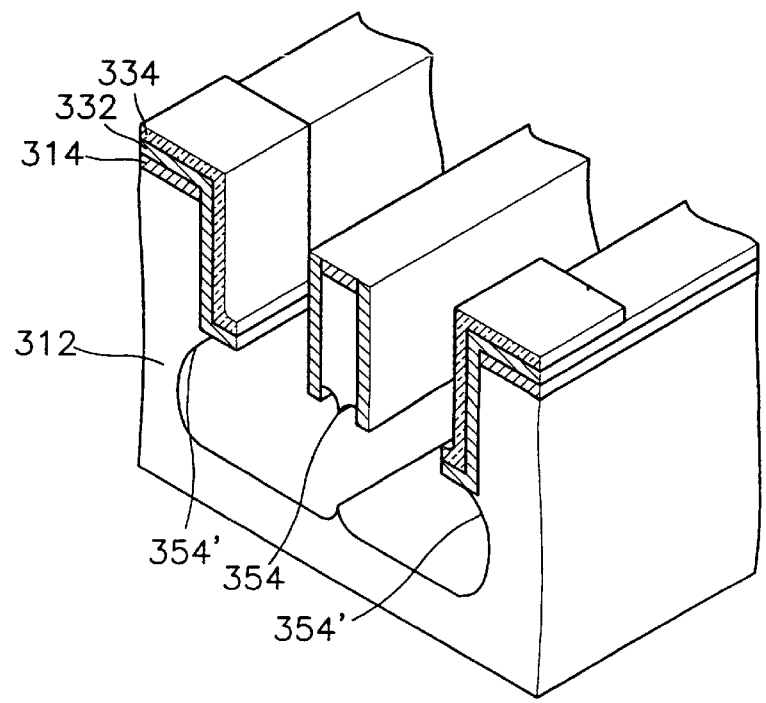
Figure 5A:
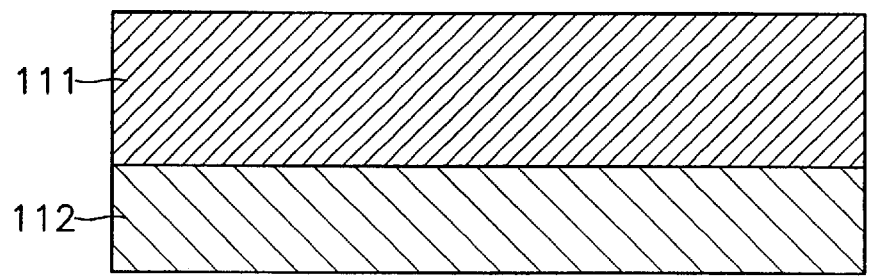
FIGS. 5A through 5F are cross-sectional views illustrating the steps of a method for fabricating micro inertia sensors, according to the present invention.

To be more specific, as shown in FIG. 5A, first, a bulk silicon 111 is bonded to a glass substrate 112. That is, a n+ (or p+) silicon substrate 111 having a low resistance is bonded to Pyrex® (Corning #7740) glass 112 by anodic bonding.

Figure 5B:
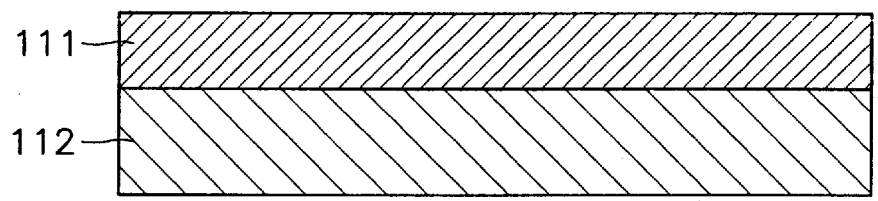

Next, as shown in FIG. 5B, the bonded silicon 111 is polished to have a desired thickness. Here, the surface of the bonded silicon is polished by mechanical or chemical polishing to have a thickness of about 40 μm.

Figure 5C:
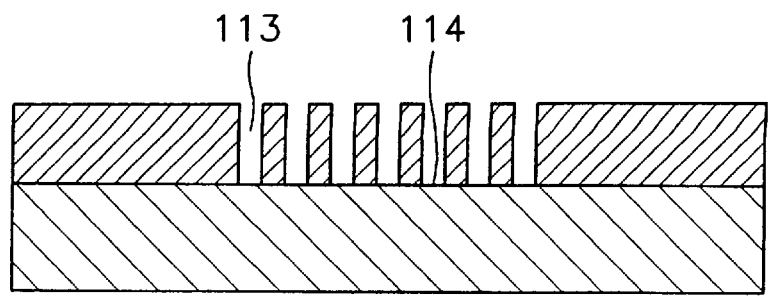

Then, as shown in FIG. 5C, the polished silicon 111 is etched by anisotropic etching, particularly, reactive ion etching (RIE), thereby forming an inertia sensor structure. This process is performed by forming photoresist (PR) patterns on the polished silicon 111. In a general RIE process, the surface of the glass 112 is rarely etched since the selectivity of the glass 112 to the silicon 111 is about 1:100 to 1:300. However, when a recently-developed ICP RIE apparatus is used as a structure dry-etching apparatus, etching at a high section ratio to obtain a groove 113 having a width of 2 μm and a depth of 40–60 μm can be achieved.

Figure 5D:
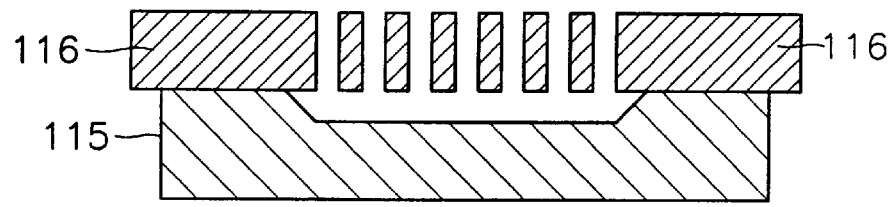

Then, as shown in FIG. 5D, the resultant structure is diced into individual chips, and glass below the bottom of the silicon inertia sensor structure is etched, thereby forming a space in which the inertia sensor structure can vibrate. That is, the etched wafer is cut into individual chips using a dicing machine. The cut individual chips are submerged into a hydrofluoric (HF) solution, and thus the HF solution flows into the side surface of the glass substrate and the groove 113, and etches glass 112 below the bottom 114 (see FIG. 5C) of the silicon inertia sensor structure and glass 115 on the side surface of a chip. Thus, a central moving structure formed with narrow grooves 113 is isolated from glass on the bottom, and wide portions 116 on both sides of the central moving structure still contact glass, and thus support the central silicon structure.

Figure 5E:
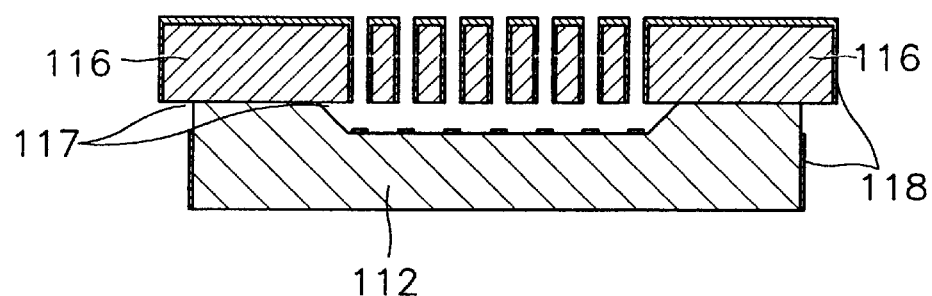

Next, as shown in FIG. 5E, an electrode metal 118 is deposited on the entire surface of the etched chips using a sputter. Although a metal is deposited on the entire surface of chips, a contact portion 117 of the silicon structure and the glass 112 is indented from the outer side surface of the silicon inertia sensor structure, such that the metal is not deposited on the contact portion 117. Accordingly, the metal film deposited on the outer side surface of the silicon inertia sensor structure is electrically insulated from the metal film deposited on the outer side surface of the glass.

Figure 5F:
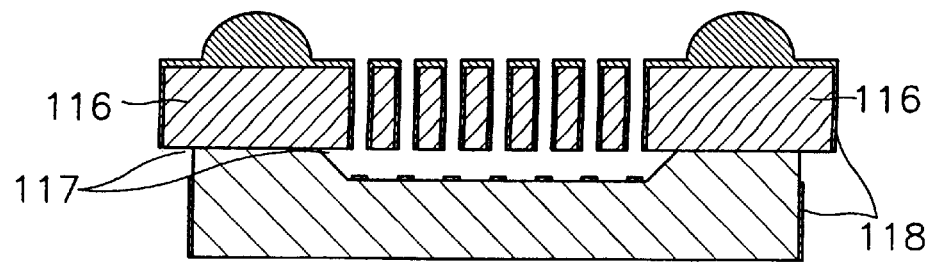

Finally, as shown in FIG. 5F, the individual chips are wire-bonded to an external package, thereby completing the fabrication of the micro inertia sensor.

This micro inertia sensor fabrication method is very simple since it is performed by a sheet of mask and five unit steps, if the packaging and wire bonding step, which is not a substantial sensor fabrication process, is excluded from the whole sensor fabrication processes. Also, a bottom surface is formed of glass, and thus completely acts as an etch stop layer when a silicon structure is formed by RIE, so that the thickness of the entire structure can be kept uniform. Also, a silicon structure is formed on glass which is an insulator, such that each functional portion of the silicon structure is electrically insulated from each other by the glass. Thus, an insulation film does not need to be formed on the upper and side surfaces of the silicon structure, and derivation of a parasitic capacitance via the substrate is prevented. Furthermore, the HF solution, which is a selective glass etchant, does not generally react to silicon, so that silicon may not be etched while glass is being etched for a long period of time.

Figure 6:
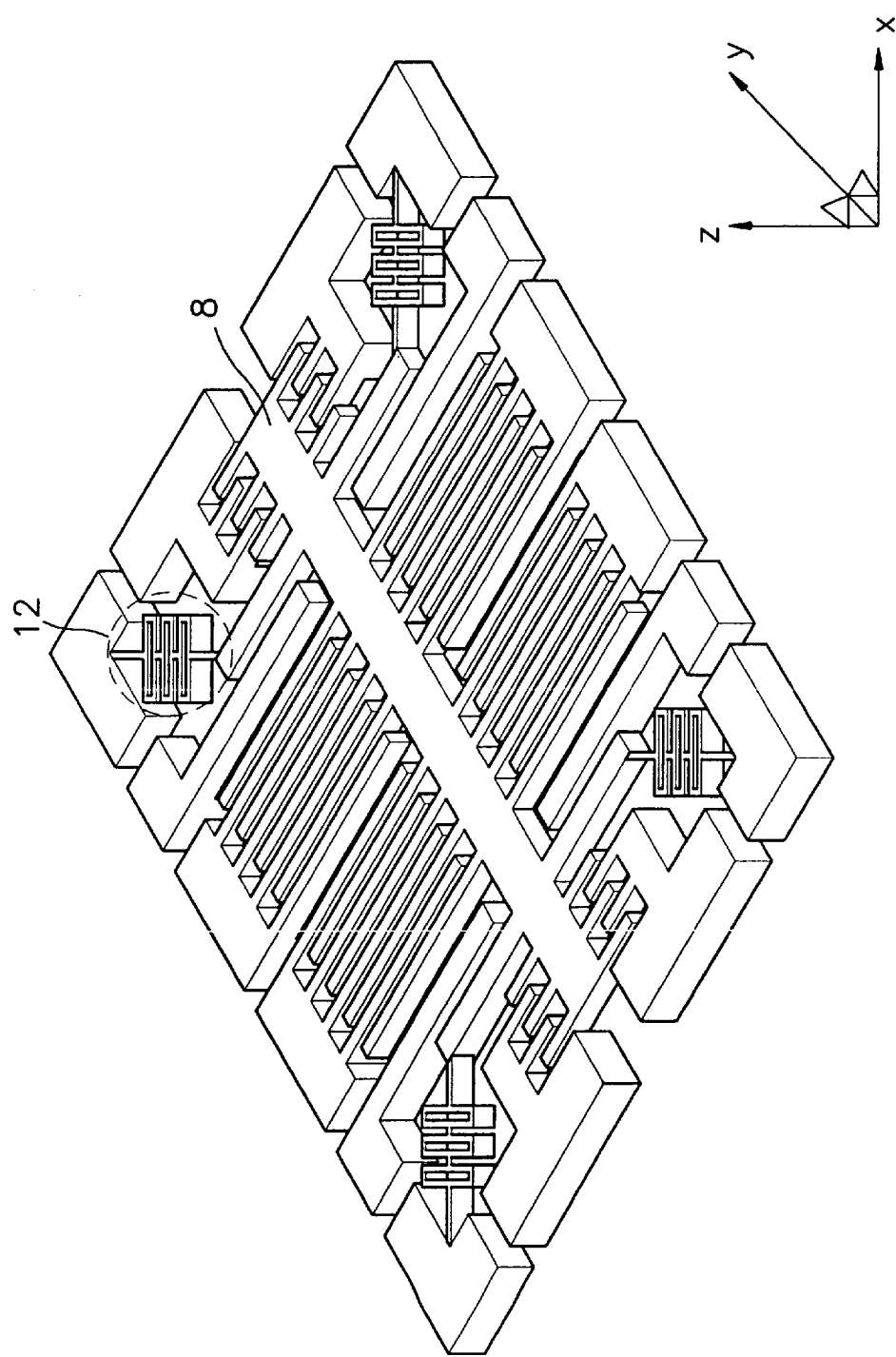
FIG. 6 is a detailed perspective view of a micro gyroscope fabricated by the micro inertia sensor fabrication method of FIGS. 5A through 5F.
Figure 7:
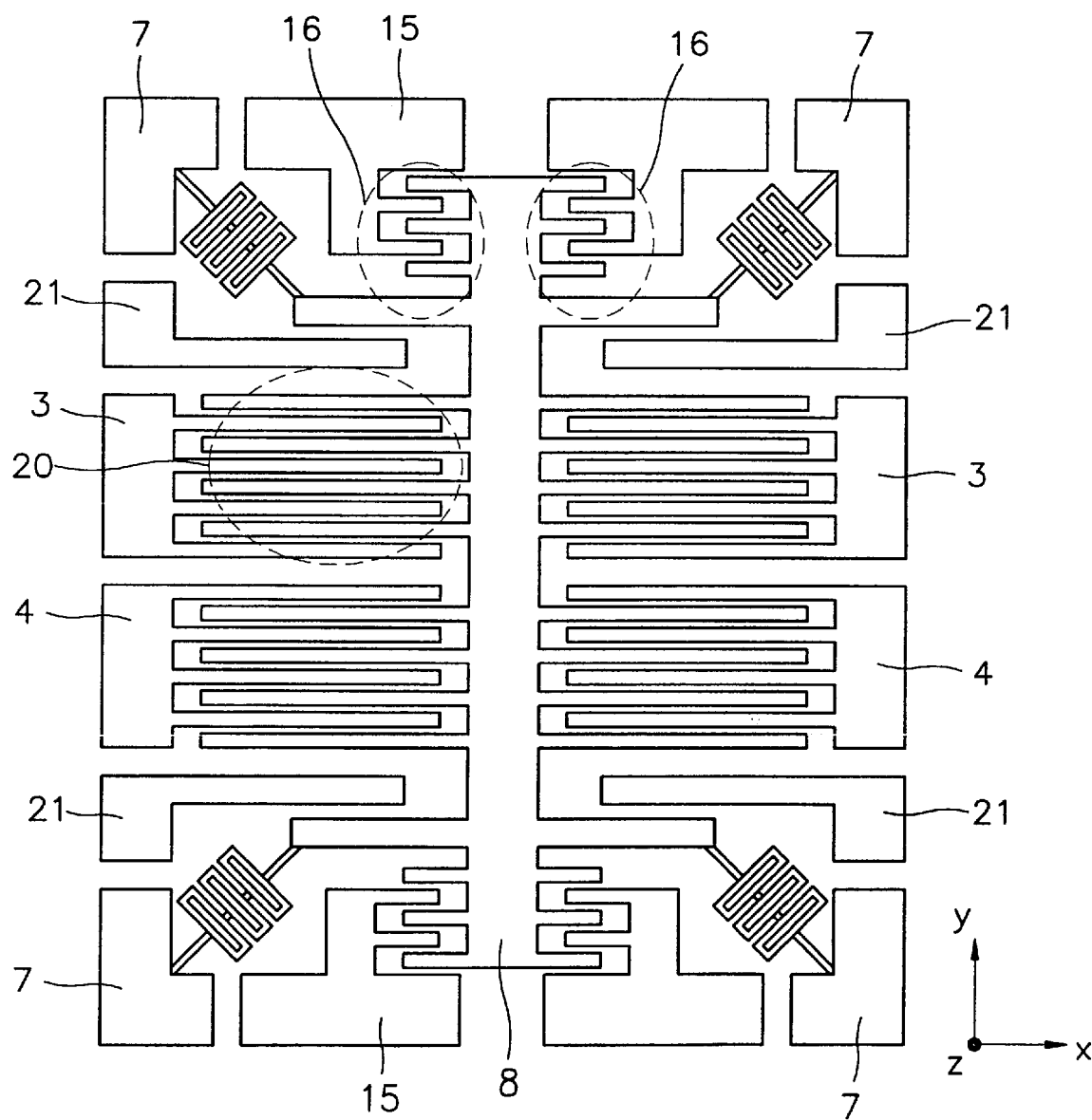
FIG. 7 is a plan view of the micro gyroscope of FIG. 6.

FIGS. 6 and 7 is a detailed perspective view and a plan view, respectively, of a micro gyroscope fabricated by the micro inertia sensor fabrication method described above.

In the operation principle of the micro gyroscope, an inertia mass 8 which is supported by a support beam 12 is grounded via an electrode 7. The sum of an alternating voltage and a direct voltage is applied to the inertia mass 8 and a fixed electrode 15 having a comb structure 16. At this time, the inertia mass 8 is vibrated at the frequency of the alternating voltage in a direction indicated by arrow x, by an electrostatic force. In order to maximize the displacement of vibration in the direction indicated by arrow x, the frequency of the alternating voltage is resonated to be consistent with the resonance frequency of a x-direction peculiar vibration mode of a structure. This displacement is monitored using a change in the capacitance of another comb structure 20.

When the angular velocity in a direction indicated by arrow z is applied from an external source to the inertia mass 8 which is producing vibration, the inertia mass 8 receives a Coriolis force Fc in a direction indicated by arrow y as in the following Equation:

$$Fc = 2m\Omega \cdot V_x$$

wherein m denotes the mass of the inertia mass 8, Ω denotes an externally-applied angular velocity, and $V_x$ denotes the velocity of oscillation in the direction of excitation (direction indicated by arrow x). The Coriolis force is expressed as a sinusoidal wave having the same frequency as the frequency of excitation, and vibrates the inertia mass 8 in a sensing direction (direction indicated by arrow y). At this time, the vibration frequency is the vibration frequency of the Coriolis force. Thus, the vibration displacement in the direction indicated by arrow y is maximized when the resonance frequency of the peculiar vibration mode in the direction indicated by arrow y is the same as the resonance frequency of a vibration mode in the direction indicated by arrow x. For this reason, the resonance frequency of vibration must be consistent with that of the sensing operation, in a gyroscope.

The vibration in the sensing direction (direction indicated by arrow y) changes the interval between the fingers of a comb structure 20 in the inertia mass 8 and fixed electrodes 3 and 4. A change in capacitance between two fingers caused by the change in the interval is measured to sense the Coriolis force. The angular velocity is detected from the sensed Coriolis force. Here, the capacitance is calculated by differentiating the change in capacitance which is obtained from the electrodes 3 and 4. Also, a gyroscope can be balanced in force by an electrode 21.

The subject matter of the present invention having this operation principle is that the support beam 12 for the inertia mass 8 is installed symmetrical to the vibration direction and the sensing direction, for example, at 45° with respect to axis x, such that a change in the valid stiffness of the beam due to manufacturing errors equally acts upon the vibration and sensing sides, so that the change on the vibration side is the same as that on the sensing side. Thus, frequencies in two directions are always constant by the difference in valid mass. This micro gyroscope is just an example of a device which can be fabricated by an inertia sensor fabrication method according to the present invention. Other embodiments fabricated by the inertia sensor fabrication method according to the present invention will now be described.

Figure 8:
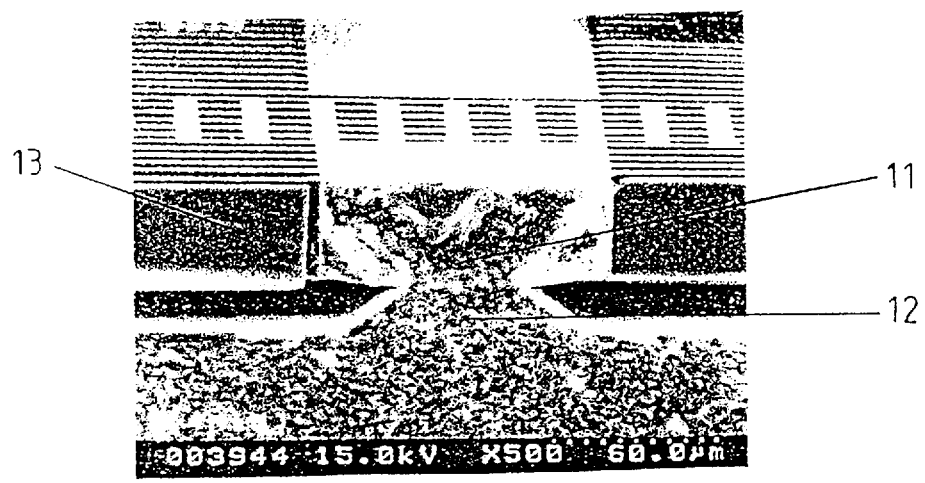
FIG. 8 is a picture of the cross section of an acceleration sensor fabricated by a micro inertia sensor fabrication method according to the present invention.

FIG. 8 is a picture of the cross section of an acceleration sensor fabricated by a micro inertia sensor fabrication method according to the present invention. As shown in FIG. 8, glass is partially etched, such that a central fixed silicon 11 is bonded to a glass surface 12, and a moving silicon structure 13 is floated over the glass surface at a predetermined interval.

Figure 9:
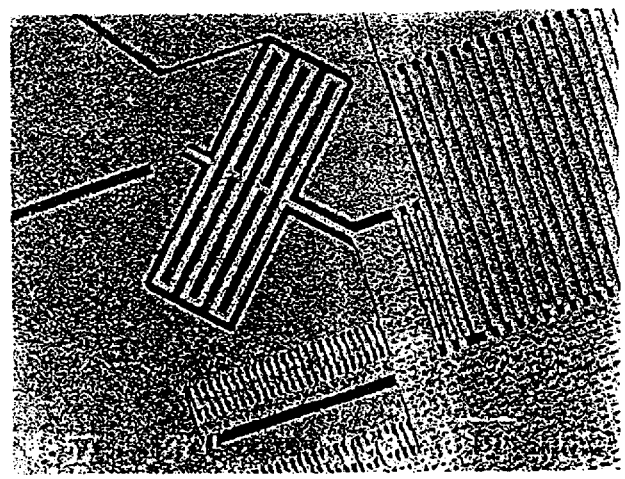
FIG. 9 is a picture of a part of the plan view of the micro gyroscope shown in FIGS. 6 and 7, which is fabricated by a micro inertia sensor fabrication method according to the present invention.
Figure 10:
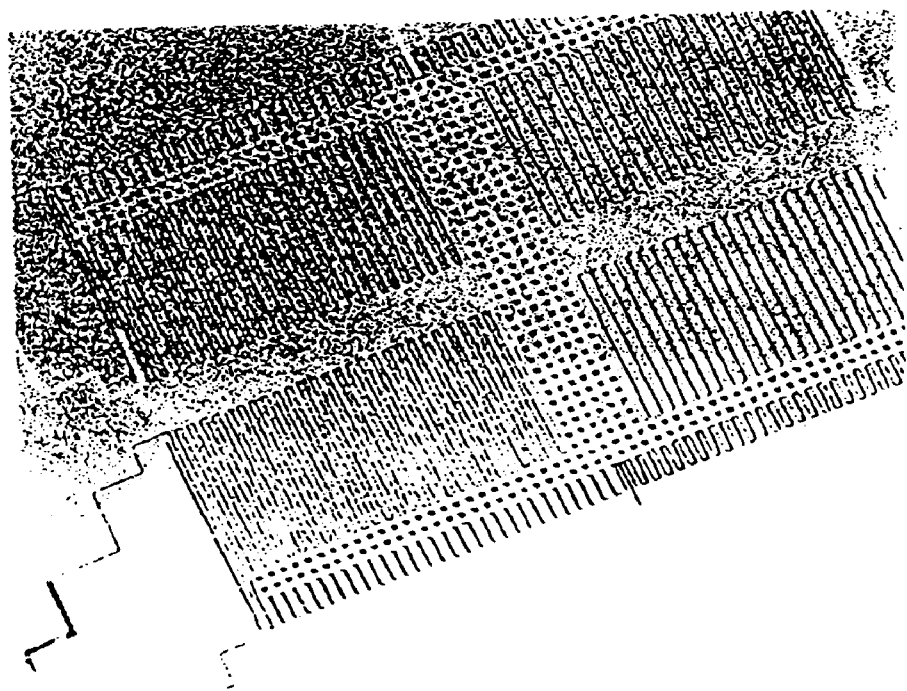
FIG. 10 is a picture of the plan view of an acceleration sensor fabricated by a micro inertia sensor fabrication method according to the present invention.

FIG. 9 is a picture of a part of the plan view of the micro gyroscope shown in FIGS. 6 and 7, which is fabricated by a micro inertia sensor fabrication method according to the present invention. FIG. 10 is a picture of the plan view of an acceleration sensor fabricated by a micro inertia sensor fabrication method according to the present invention.

As described above, in the micro inertia sensor fabrication method according to the present invention, silicon is bonded to a glass substrate, the bonded silicon is polished to have a desired thickness, a silicon structure is formed by etching the polished silicon using an RIE method, and the silicon structure is separated from the bottom by selectively etching glass below the silicon structure via grooves in etched silicon. In this method, a thick silicon layer bonded to glass is processed at a high section ratio to increase the area and thickness of the silicon layer measured, thereby improving the reliability and performance. Also, a simple process using only one mask can reduce the manufacturing cost of an inertia sensor. Also, the glass bottom surface completely acts as an etch stop layer during RIE, so that the thickness of the entire structure is kept uniform. The use of thick and stable single crystal silicon to form a silicon structure increases the reliability of the sensor. The silicon structure is formed on glass which is an insulator, such that the functional portions of the silicon structure are electrically insulated from each other. Thus, an insulation film does not need to be formed on the upper and side surfaces of the silicon structure, and derivation of a parasitic capacitance via the substrate is prevented. Furthermore, an HF solution, which is a selective glass etchant, generally does not react to silicon, so that silicon may not be etched while glass is being etched for a long period of time.

What is claimed is:

1. A method of fabricating a micro inertia sensor, comprising:
   (a) bonding bulk silicon to a glass substrate;
   (b) forming an inertia sensor structure by anisotropically etching the bulk silicon;
   (c) forming a vacuum space by etching glass below the silicon inertia sensor structure;
   (d) depositing a metal for use as an electrode on a top surface and the surface of the silicon inertia sensor structure which has been etched.

2. The method of claim 1, wherein in the step (a), the glass substrate is formed of Pyrex® glass, and the bulk silicon is $n^+$ or $p^+$-doped bulk silicon.

3. The method of claim 1, wherein in the step (a), the glass substrate is bonded to the bulk silicon by anodic bonding.

4. The method of claim 1, wherein the anisotropic etching method in the step (c) is a reactive ion etching (RIE) method.

5. The method of claim 4, wherein in the step b, the RIE method is performed after a photoresist pattern is formed on the polished bulk silicon.

6. The method of claim 4, wherein in the step b, the RIE method is performed at an etching selectivity of the glass substrate to the bulk silicon in the range of 1:100 to 1:300.

7. The method of claim 1, before the step e, further comprising dicing the glass substrate having the inertia sensor structure formed thereon, into individual chips.

8. The method of claim 7, wherein in the step c, the cut individual chips are dipped into a hydrofluoric (HF) solution, and thus the HF solution flows into grooves and etches glass below the inertia sensor structure.

9. The method of claim 1, wherein the step d is performed by sputtering.

10. The method of claim 7, after the step d, further comprising packaging and wire bonding the individual chips.

11. The method of claim 2, wherein in the step (a), the glass substrate is bonded to the bulk silicon by anodic bonding.

12. The method of claim 5, wherein the step b, the RIE method is performed at an etching selectivity of the glass substrate to the bulk silicon in the range of 1:100 to 1:300.

13. The method of claim 1, comprising the step of polishing the bonded bulk silicon to have a desired thickness prior to etching the bulk silicon.

14. The method of claim 13, the bonded silicon surface is polished by mechanical or chemical polishing.

* * * * *